US012652782B2

(12) United States Patent
Wellens et al.

(10) Patent No.: US 12,652,782 B2
(45) Date of Patent: Jun. 9, 2026

(54) ELECTRONIC ASSEMBLY

(71) Applicant: VALEO COMFORT AND DRIVING ASSISTANCE, Créteil (FR)

(72) Inventors: Matthias Wellens, Créteil (FR); Hubert Gleich, Créteil (FR); Dirk Wischnewski, Créteil (FR); Vincent Groebel, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 170 days.

(21) Appl. No.: 18/267,988

(22) PCT Filed: Nov. 3, 2021

(86) PCT No.: PCT/EP2021/080453
§ 371 (c)(1),
(2) Date: Jun. 16, 2023

(87) PCT Pub. No.: WO2022/128239
PCT Pub. Date: Jun. 23, 2022

(65) Prior Publication Data
US 2024/0064940 A1     Feb. 22, 2024

(30) Foreign Application Priority Data
Dec. 17, 2020    (EP) .................................... 20214815

(51) Int. Cl.
*H05K 7/20*          (2006.01)
*H05K 1/02*          (2006.01)

(52) U.S. Cl.
CPC ..... *H05K 7/20509* (2013.01); *H05K 7/20445* (2013.01); *H05K 1/0204* (2013.01); *H05K 2201/10969* (2013.01)

(58) Field of Classification Search
CPC ........... H05K 7/20509; H05K 7/20418; H05K 7/20436; H05K 1/0204
See application file for complete search history.

(56) References Cited

U.S. PATENT DOCUMENTS 5,708,566 A     1/1998  Hunninghaus et al.
5,923,084 A     7/1999  Inoue et al.
(Continued)

FOREIGN PATENT DOCUMENTS

DE     102010064343 A1     7/2012
DE     202014000544 U1     2/2014
(Continued)

OTHER PUBLICATIONS

Office Action issued in counterpart Japanese Patent Application No. 2023-537048 mailed Jul. 30, 2024 (21 pages).
(Continued)

*Primary Examiner* — Jeremy C Norris
(74) *Attorney, Agent, or Firm* — Osha Bergman Watanabe & Burton LLP

(57)          ABSTRACT
The invention relates to an electronic assembly (1) comprising a printed circuit board (4), an electronic module (2) fixed on a first side (5) of the printed circuit board (4), a casing (3) having a thermally conductive wall (9), fastening means (18) configured to keep the printed circuit board (4) at a distance from the thermally conductive wall (9) inside the casing (3), a housing (7) extending from an inner side (19) of the thermally conductive wall (9), and a cooling module (8) placed in the housing (7) so as to be thermally coupled to both the thermally conductive wall (9) and the electronic module (2), the housing (7) being configured to restrain the movements of the cooling module (8) in any direction parallel to the thermally conductive wall (9).

14 Claims, 3 Drawing Sheets

(56) References Cited

U.S. PATENT DOCUMENTS

| | | | | |
|---|---|---|---|---|
| 6,269,866 B1 * | 8/2001 | Yamamoto | .......... | F28D 15/0233 |
| | | | | 174/15.2 |
| 2007/0086168 A1 | 4/2007 | Khanna et al. | | |
| 2013/0093270 A1 | 4/2013 | Kokas et al. | | |
| 2017/0170542 A1 | 6/2017 | Lei et al. | | |
| 2020/0275583 A1 * | 8/2020 | Lee | ........................ | H05K 7/205 |

FOREIGN PATENT DOCUMENTS

| | | | |
|---|---|---|---|
| JP | H09-055459 | A | 2/1997 |
| JP | 2004-006791 | A | 1/2004 |
| JP | 2006-278259 | A | 10/2006 |
| JP | 2007-110115 | A | 4/2007 |
| JP | 2008-218934 | A | 9/2008 |
| JP | 2009-182922 | A | 8/2009 |

OTHER PUBLICATIONS

International Search Report and Written Opinion in corresponding International Application No. PCT/EP2021/080453, dated Feb. 24, 2022 (11 pages).

* cited by examiner

Fig.4

ELECTRONIC ASSEMBLY

TECHNICAL FIELD

The invention belongs to the technical field of electronic devices, and relates specially to electronic devices used in automotive vehicles, for instance telecommunication devices used for telematics operations in cars, and also relates to means for cooling electronic devices. In particular, the invention concerns an electronic assembly.

TECHNOLOGICAL BACKGROUND

Telematics control units are embedded electronic systems that perform telecommunication operations, for instance operations of tracking of the vehicle. In order to optimize the telecommunication performance, telematics control units are placed on the roof of the vehicle.

The temperature of the roof of a vehicle is subject to large variation. For instance, the temperature of the roof of a black car exposed to solar radiation during a sufficiently long period of time may reach more than 90° C. The optimal temperature for a good functioning of the telematics control unit is often below this limit. Such temperature rises may hinder the proper functioning of the control unit and thus represent a risk for the safety of the driver or for the safety of the other road users.

Several solutions exist to cool down the telematics control units. These solutions have drawbacks, comprising a high structural complexity, too much volume and poor efficiency.

SUMMARY OF THE INVENTION

The invention proposes to solve the above-mentioned technical drawbacks of the prior art with an electronic assembly for cooling down an electronic device, said assembly having a simple structure, being compact and being efficient.

According to an aspect of the invention, the invention relates to an electronic assembly comprising a printed circuit board, an electronic module fixed on a first side of the printed circuit board, a casing having a thermally conductive wall, fastening means configured to keep the printed circuit board at a distance from the thermally conductive wall inside the casing, a housing extending from an inner side of the thermally conductive wall, and a cooling module placed in the housing so as to be thermally coupled to both the thermally conductive wall and the electronic module, the housing being configured to restrain the movements of the cooling module in any direction parallel to the thermally conductive wall.

Thanks to the invention, the cooling module is protected against any mechanical stress in a direction parallel to the thermally conductive wall. Moreover, the use of a wall of the casing to conduct heat increases the heat dissipation and thus enhances the cooling efficiency of the assembly.

In the meaning of the invention, a material is qualified as thermally conductive when it allows a sufficient exchange of heat with its environment, i.e. here when it has a heat transfer coefficient greater than 50 $W \cdot M^{-1} \cdot K$.

In the meaning of the invention, the wording "thermal coupling" implies a thermal transfer with or without physical contact.

According to an embodiment of the invention, the housing comprises a plurality of fingers extending from the inner side of the thermally conductive wall, the plurality of fingers being configured to restrain said movements of the cooling module.

A housing comprising fingers is advantageous to lighten the assembly and to allow a thermal transfer between the cooling module and the ambient air.

According to an embodiment of the invention, the housing extends from the thermally conductive wall to the printed circuit board.

A housing extending to the printed circuit board is advantageous since it protects the cooling module from a compression between the thermally conductive wall and the printed circuit board.

According to an embodiment of the invention, the printed circuit board comprises a second side opposite to the first side, said second side comprising a metal ground plane, said cooling module being thermally coupled with said electronic module via a contact with the metal ground plane.

The metal ground plane advantageously increases the thermal conduction between the cooling module and the electronic module.

According to an embodiment of the invention, the printed circuit board comprises a through-hole being located in an area corresponding to the outlines of the electronic module, said cooling module being in contact with said electronic module via the through-hole.

The through-hole allows a direct contact between the electronic module and the cooling module, increasing therefore the thermal transfer between those elements.

According to an embodiment of the invention, the cooling module is thermally coupled to the thermally conductive wall and to the electronic module via thermal pads, thermal paste or thermal foam.

Thermal pads, thermal foam or thermal paste increase the heat transfer between the cooling module, the thermally conductive wall and the electronic module. Moreover, the thermal pads, the thermal foam or the thermal paste also act as mechanical stress absorbers.

According to an embodiment of the invention, an outer side of the thermally conductive wall, opposite to the inner side, comprises an area located at least partially in an area corresponding to the outlines of the cooling module and comprising a plurality of fins.

The plurality of fins increases the surface of the outer side of the thermally conductive wall, increasing therefore the thermal transfer with the exterior of the casing.

According to an embodiment of the invention, the fastening means are fixed to the thermally conductive wall and are thermally conductive.

Such fastening means advantageously allow a thermal path between the printed circuit board and the thermally conductive wall.

According to an embodiment of the invention, the fastening means comprise at least one metal screw.

According to an embodiment of the invention, the housing is thermally conductive.

According to an embodiment of the invention, the thermally conductive wall and the housing are made of the same material.

According to an embodiment of the invention, the thermally conductive wall and the housing form a single piece of material.

The thermal transfer between the housing and the thermally conductive wall is therefore enhanced.

According to an embodiment of the invention, the cooling module is a Peltier cooler.

The use of a Peltier cooler, or thermoelectric cooler, enhances the cooling capacity of the assembly.

According to an embodiment of the invention, the electronic module is a telecommunication circuit.

The different characteristics, variants, and embodiments of the invention may be combined with each other in various combinations insofar as they are not incompatible or exclusive of each other.

DESCRIPTION OF THE DRAWINGS

Many other features of the invention are apparent from the following description made with reference to the drawings which illustrate embodiments of the invention, in no way limiting, and where:

FIG. 4 illustrates an electronic assembly according to another embodiment of the invention.

It should be noted that in these figures, the structural and/or functional elements common to the different embodiments may have the same references.

DESCRIPTION OF EMBODIMENTS

Figure 3:
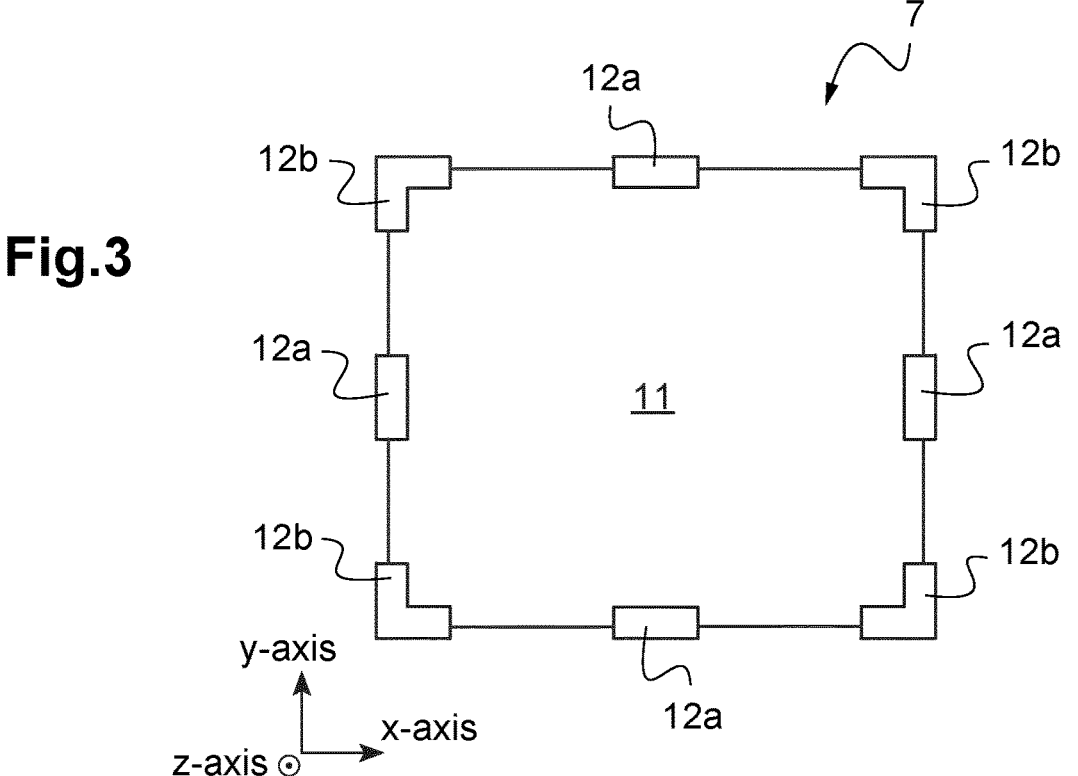
FIG. 3 illustrates a cross-section of a housing according to an embodiment of the invention.
Figure 2:
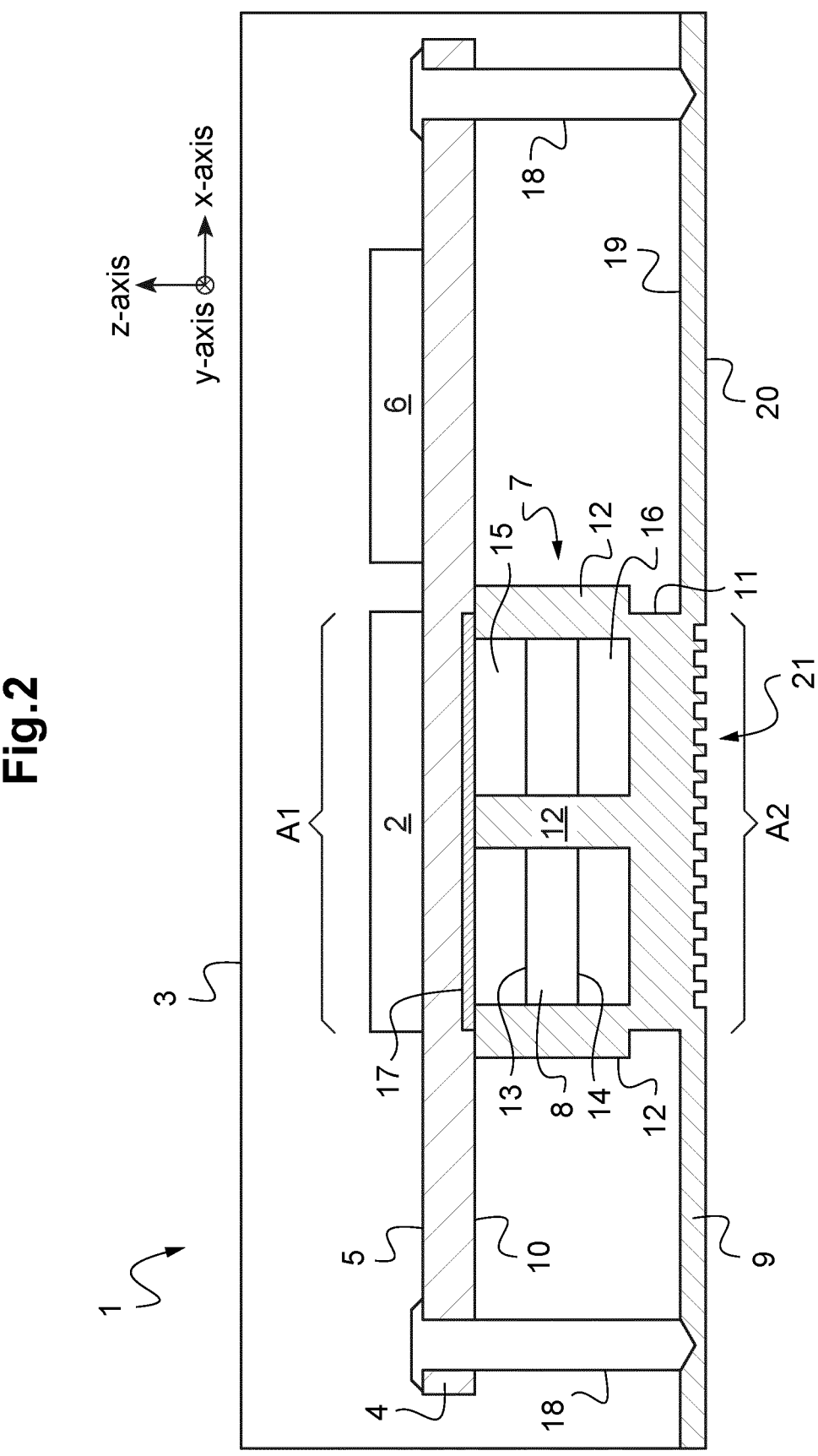
FIG. 2 illustrates an electronic assembly according to an embodiment of the invention.
Figure 4:
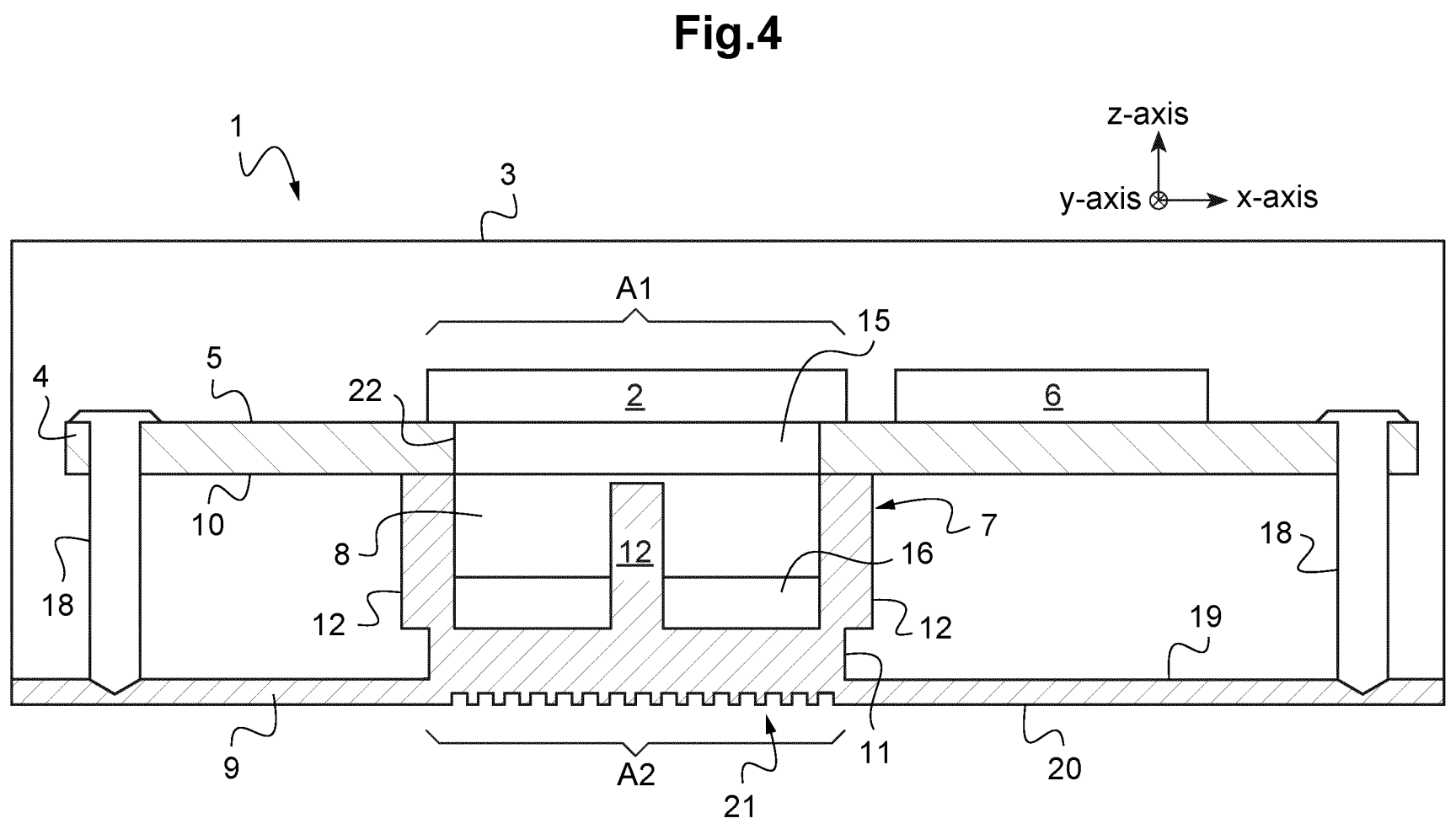

In order to improve the understanding of the description and the reading of the figures, an orthogonal system defining three directions x, y and z is used in the description and visible on FIGS. 2, 3 and 4.

Figure 1:
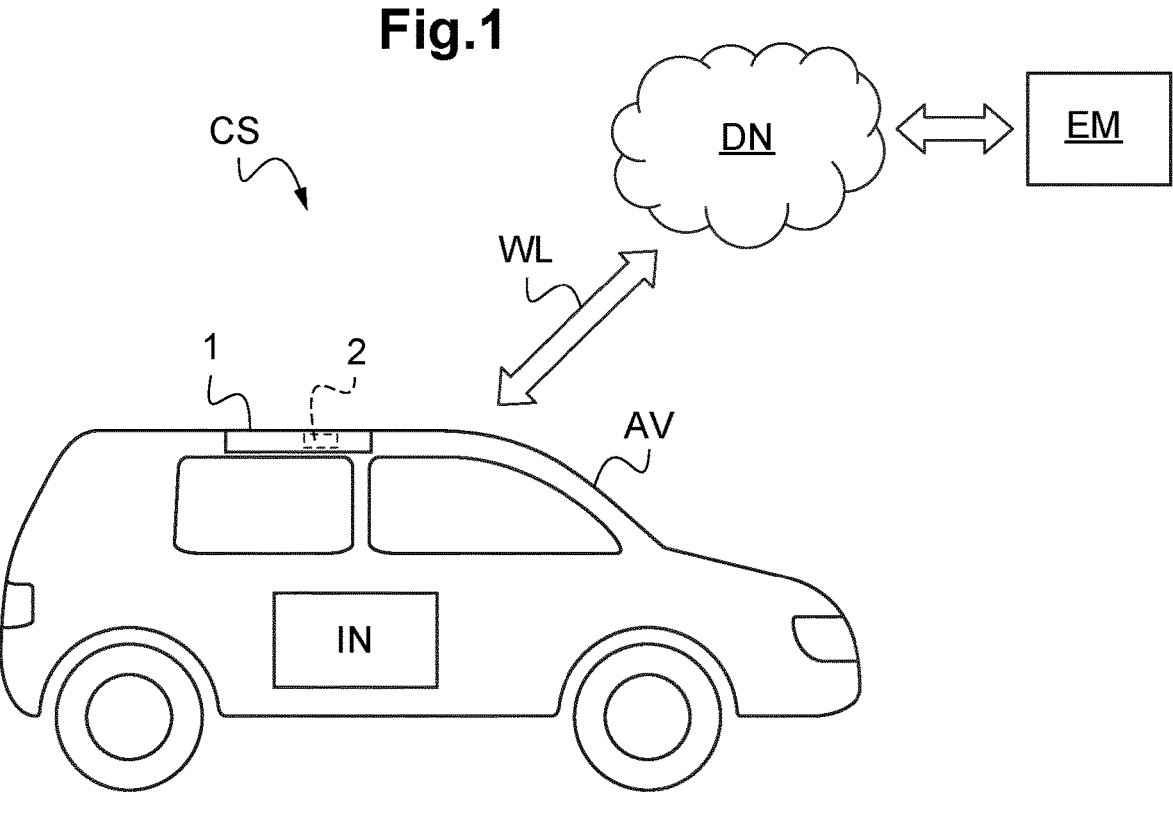
FIG. 1 illustrates a telecommunication system in which an electronic assembly according to the invention is embedded in a car.

FIG. 1 illustrates a communication system CS comprising an automotive vehicle AV, a distant network DN with which the automotive vehicle is able to establish a wireless communication link WL, and an equipment manufacturer backend system EM linked to the distant network DN so that a communication channel may be established between the automotive vehicle AV and the equipment manufacturer backend system EM.

In this embodiment, the automotive vehicle AV (here, a car) comprises an electronic assembly 1 according to the invention, here located on the roof of the automotive vehicle AV. The electronic assembly 1 of this example comprises an electronic module 2, the electronic module 2 being here a telecommunication circuit, for instance a Network Access Device. The electronic module 2 is configured here to establish the wireless communication link WL with the distant network DN. In this embodiment, the distant network comprises the Internet network and/or a cellular network.

The automotive vehicle AV is equipped with an internal network IN comprising and linking together various electronics units (for instance, command units, displays, sensors . . . ) of the vehicle AV, among which the electronic module 2 hosted by the electronic assembly 1. Therefore, the electronic module 2 may communicate with the internal network IN of the automotive vehicle and exchange data with the equipment manufacturer backend system BS through the distant network DN.

The exchanged data may comprise information about the location and the speed of the car, information relating to the maintenance of the vehicle, for instance alerts about a failure of equipment, and more generally to various signals from the sensors of the vehicle AV.

FIG. 2 is a cross-view of an embodiment of the electronic assembly 1. The electronic assembly 1 comprises a casing 3 enclosing a printed circuit board 4, the electronic module 2 fixed on a first side 5 of the printed circuit board 4, a plurality of electronic components 6 fixed on the first side 5 of the printed circuit board 4, a housing 7 and a cooling module 8 housed in the housing 7. For instance, the plurality of electronic components 6 comprises an antenna.

The casing 3 comprises a thermally conductive wall 9, here a metallic wall, for instance an aluminium wall. The other walls of the casing 3 comprise a material that does not interfere with radio frequency waves, so as to allow the establishment of the wireless communication link WL. For instance here, the other walls of the casing 3 are made of plastic material. On FIG. 2, the thermally conductive wall 9 extends in the x-y plane.

The printed circuit board 4 is located in the casing 3 at distance of the thermally conductive wall 9, so that a second side 10 of the printed circuit board 4 opposite to the first side 5 faces the thermally conductive wall 9. The printed circuit board 4 comprises an alternation of electrically conductive layers and electrically insulated layers and comprises through-hole vias which extends from the first side 5 to the second side 10 of the printed circuit board 4 and which are filled with electrically conductive material, for instance metal, here copper. Thus, the printed circuit board 4 is thermally conductive in the meaning of the invention. On FIG. 2, the printed circuit board 4 extends in the x-y plane and the through-hole vias extend in the z direction.

The printed circuit board 4 is fixed to the casing 3, in this example to the thermally conductive wall 9, by means of fastening means 18, in this example by means of screws. In this embodiment, the screws 18 are thermally conductive, and more precisely made of metal.

The housing 7 comprise a baseplate 11 fixed on an inner side 19 of the thermally conductive wall 9, the baseplate 11 being in this embodiment formed by a protrusion in the thermally conductive wall. The housing 7 comprises a plurality of fingers 12 extending away from the baseplate 11, that is to say here extending toward the printed circuit board 4. In this embodiment, the fingers extend so as to be in physical contact with the printed circuit board 4. The baseplate forms the bottom of the housing 7 and the plurality of fingers 12 extends from the edge of the baseplate 11 and thus defines the side borders of the housing 7.

As shown on FIG. 3 which is a cross view of the fingers 12 in the x-y plane, the baseplate 11 is rectangular shape, for instance in this example square-shape, and the housing 7 comprises eight fingers 12, four fingers 12a extending from a side of the baseplate 11, four other fingers 12b extending from a corner of the baseplate. The fingers 12a and 12b of FIG. 3 have angular cross-sections, but in other embodiments the fingers may have cross section of any shape.

In this embodiment, the thermally conductive wall 9, the baseplate 11 and the fingers 12 are made in a same piece of material, here aluminium. In other words, the thermally conductive wall 9 and the housing 7 form a monolithic structure.

The cooling module 8 is housed in the housing 7, so that the plurality of fingers 12 restrain its movements in any direction parallel to the thermally conductive wall, here in the x and y directions. Therefore, the fingers 12 of the plurality of fingers are in physical contact with the cooling module 8.

The cooling module 8 is housed in the housing 7 so as to be thermally coupled to the baseplate 11 and therefore to the thermally conductive wall 9, and so as to be thermally coupled to the electronic module 2. In this embodiment, the cooling module 8 comprised a first surface 13 and a second surface 14 opposite to the first surface 13, the first surface 13 being in contact with the printed circuit board 4 via a first layer of thermal paste 15 and the second surface 14 being in contact with the baseplate 11 via a second layer of thermal paste 16. The invention is also compatible with thermal pads or thermally conductive foam instead of thermal paste.

The second side 10 of the printed circuit board 4 comprises a ground plane 17, that is to say a metallic plane, for instance here a copper plane, located in a first area A1 corresponding to the outline of the electronic module. In other words and considering the orientation of the electronic assembly 1 on FIG. 2, the ground plane 17 is located under the electronic module. The first layer of thermal paste 15 is in physical contact with the ground plane 17.

The cooling module 8 of this embodiment is a Peltier cooler, or thermoelectric cooler. The cooling module 8 is therefore powered with electricity to transfer heat from the first surface 13 to the second surface 14. A heat transfer that relies on an external source of energy is qualified as "active". Therefore, a Peltier cooler, which consumes electricity, is an active cooling device. On the contrary, a heat transfer that does not rely on any external energy source is qualified as passive.

An outer side 20 of the thermally conductive wall comprises a second area A2 corresponding to the outline of the cooling module 8, which comprises a plurality of fins 21. The surface of the outer side 20 is therefore increased.

The electronic assembly 1 described above comprises at least four thermal paths from the electronic module 2 to the thermally conductive wall. A first thermal path passes through the printed circuit board 4, the cooling module 8 (via the thermal paste layers 15 and 16) and the baseplate 11. A second thermal path passes through the printed circuit board 4 and the screws 18. A third thermal path passes through the printed circuit board 4 and the ambient air. A fourth thermal path passes through the printed circuit board 4, the fingers 12 and the baseplate 11.

The first thermal path is an active thermal path since it implies the Peltier cooler 8, which consumes electricity, and the second, third and fourth thermal paths are passive thermal paths since they do not consume energy.

According to an embodiment of the invention illustrated on FIG. 4, the printed circuit board 4 comprises a through-hole 22 located in the first area A1 and extending from the first side 5 of the printed circuit board 4 to the second side 10 of the printed circuit board 4. The dimensions of the through-hole 22 are smaller than those of the first area A1 so that the electronic module 2 remains fixed to the first side 5 of the printed circuit board.

The cooling module 8 extends through the through-hole 22 to the electronic module 2, and is in contact, via the first layer of thermal paste 15, with the electronic module 2.

In the previously described embodiments, the cooling module 8 protrudes from the through-hole 22, since the thickness (measured in the z direction) of the printed circuit board 4 is lower than the thickness of the cooling module 8. In other embodiments, the thickness of the printed circuit board 4 is higher than the thickness of the cooling module 8, so that the cooling module 8 does not protrude from the through-hole 22.

In such embodiments, the x and y dimensions of the housing 7 are lower from to the x and y dimensions of the through hole 22, so the fingers 12 may extend in the through hole 22 in order to restrain the movement of the cooling module 8 and to contact the cooling module 8, thus allowing heat transfer between these elements.

Furthermore, in such embodiments, the housing 7 may comprise at least a central finger or a central protrusion extending from the baseplate 11 to the cooling module 8 so as to be in contact with the cooling module 8 via the second layer of thermal paste 16. Therefore, such central finger or central protrusion is shorter (in the z direction) than the fingers 12.

In embodiments of the invention in which the electronic assembly is embedded in an automotive vehicle, as illustrated on FIG. 1, the thermally conductive wall is advantageously in physical contact with the vehicle bodywork. Thus, the vehicle bodywork acts as a heatsink and the efficiency of the cooling is enhanced.

The invention is not limited to the embodiments described above in relation with FIG. 1 to 4.

For instance, it has been described a housing 7 having a baseplate 11 from which the fingers 12 extend. In other embodiments, the housing may not comprise the baseplate 11, the fingers 12 then extending directly from the inner side 19 of the thermally conductive wall 9.

Moreover, the fingers 12 described above extend from the baseplate 11 or from the thermally conductive wall 9 to the printed circuit board 4, so as to be in physical contact with the printed circuit board 4. This solution is advantageous to reduce mechanical stress applied to the cooling module 8 in the z direction. However, other embodiments of the invention comprise at least some of the fingers 12 which extend toward the printed circuit board 4 but are not in contact with the printed circuit board 4. The extremities of those fingers are therefore located at a distance from the printed circuit board 4.

The electronic assembly 1 described above performs an active cooling, thanks to the cooling module 8 being a Peltier cooler. The invention is also compatible with a passive cooling, and embodiments of the invention comprise a passive cooling module located in the housing 7.

The dimensions and location of the ground plane 17 described above correspond to the first area A1. In other embodiments, the dimensions of the ground plane 17 may be different from those of the first area A1 (that is to say from those of the electronic module), for instance smaller or larger. For instance, the ground plane may cover the whole second side 10 of the printed circuit board 4. Also, in some embodiments, the ground plane 17 may extend only in a portion of the first area A1.

Similarly, the plurality of fins 21 may extend on the whole outer side 20 of the thermally conductive wall 9 or on a surface smaller than the second area A2. Although fins have been described, another shape may be used to increase the surface of the outer side 20 of the thermally conductive wall 9. For instance, the outer side 20 may comprise ripples, cones, fingers, pads, etc.

Finally, it has been described a thermally conductive wall and a housing being in the same material and forming a monolithic structure. In other embodiment of the invention, the housing 7 and the thermally conductive wall 9 may be made in separate pieces of material and may be made in distinct materials.

The invention claimed is:
1. An electronic assembly comprising:
a printed circuit board;
an electronic module fixed on a first side of the printed circuit board;
a casing having a thermally conductive wall;

fastening means configured to keep the printed circuit board at a distance from the thermally conductive wall inside the casing;

a housing extending from an inner side of the thermally conductive wall; and a cooling module placed in the housing so as to be thermally coupled to both the thermally conductive wall and the electronic module, the housing being configured to restrain the movements of the cooling module in any direction parallel to the thermally conductive wall.

2. The electronic assembly according to claim 1, wherein the housing comprises a plurality of fingers extending from the inner side of the thermally conductive wall, the plurality of fingers being configured to restrain said movements of the cooling module.

3. The electronic assembly according to claim 1, wherein the housing extends from the thermally conductive wall to the printed circuit board.

4. The electronic assembly according to claim 1, wherein the printed circuit board comprises a second side opposite to the first side, said second side comprising a metal ground plane, said cooling module being thermally coupled with said electronic module via a contact with the metal ground plane.

5. The electronic assembly according to claim 1, wherein the printed circuit board comprises a through-hole being located in an area corresponding to the outlines of the electronic module, said cooling module being in contact with said electronic module via the through-hole.

6. The electronic assembly according to claim 1, wherein the cooling module is thermally coupled to the thermally conductive wall and to the electronic module via thermal pads, thermal paste or thermal foam.

7. The electronic assembly according to claim 1, wherein an outer side of the thermally conductive wall, opposite to the inner side, comprises an area located at least partially in an area corresponding to the outlines of the cooling module and comprising a plurality of fins.

8. The electronic assembly according to claim 1, wherein the fastening means are fixed to the thermally conductive wall and are thermally conductive.

9. The electronic assembly according to claim 8, wherein the fastening means comprise at least one metal screw.

10. The electronic assembly according to claim 1, wherein the housing is thermally conductive.

11. The electronic assembly according to claim 1, wherein the thermally conductive wall and the housing are made of the same material.

12. The electronic assembly according to claim 11, wherein the thermally conductive wall and the housing form a single piece of material.

13. The electronic assembly according to claim 1, wherein the cooling module is a Peltier cooler.

14. The electronic assembly according to claim 1, wherein the electronic module is a telecommunication circuit.

* * * * *